United States Patent [19]
Saitoh et al.

[11] Patent Number: 5,435,875
[45] Date of Patent: Jul. 25, 1995

[54] METHOD OF MANUFACTURING CAVITIED CERAMIC MULTILAYER BLOCK

[75] Inventors: Tsuyoshi Saitoh; Shoichi Kawabata; Norio Sakai, all of Kyoto, Japan

[73] Assignee: Murata Mfg. Co., Ltd., Japan

[21] Appl. No.: 186,423

[22] Filed: Jan. 25, 1994

[30] Foreign Application Priority Data

Jan. 27, 1993 [JP] Japan .................................. 5-011568

[51] Int. Cl.6 .................... B29C 31/04; B32B 31/20; B32B 31/04
[52] U.S. Cl. ...................... 156/245; 156/89; 156/242; 156/288; 156/323; 264/61
[58] Field of Search ................. 156/89, 242, 245, 288, 156/323, 581; 65/42; 264/61

[56] References Cited

U.S. PATENT DOCUMENTS

| | | | |
|---|---|---|---|
| 4,737,208 | 4/1988 | Bloechle et al. | 156/90 |
| 5,116,440 | 5/1992 | Takeguchi et al. | 156/90 |

FOREIGN PATENT DOCUMENTS

| | | |
|---|---|---|
| 2222800 | 3/1990 | United Kingdom . |
| 9325385 | 12/1993 | WIPO . |

OTHER PUBLICATIONS

"Dictionary of Scientific and Technical Terms", 3rd Edition, 1984, p. 776.

Primary Examiner—Michael W. Ball
Assistant Examiner—Richard Crispino
Attorney, Agent, or Firm—Ostrolenk, Faber, Gerb & Soffen

[57] ABSTRACT

When a plurality of ceramic green sheets provided with cavity holes are respectively pressed by an elastic member, rigid plates which are sized to be in contact with overall major surfaces of the respective ceramic green sheets and provided with holes equivalent to or slightly smaller than the cavity holes are interposed between the elastic member and the respective ceramic green sheets. Thus, the cavity holes are inhibited from undesired deformation caused by deformation of the elastic member.

9 Claims, 3 Drawing Sheets

METHOD OF MANUFACTURING CAVITIED CERAMIC MULTILAYER BLOCK

BACKGROUND OF THE INVENTION

1. Field of the Invention

The present invention relates to a method of manufacturing a cavitied ceramic multilayer block for obtaining a cavitied ceramic multilayer circuit board which is adapted to form an IC package, and more particularly, it relates to an improvement in a pressing step which is carried out after stacking ceramic green sheets with each other.

2. Description of the Background Art

A ceramic multilayer circuit board, which is provided with wiring patterns in interfaces between ceramic layers forming the ceramic multilayer circuit board and via holes passing through specific ones of the ceramic layers for connecting the wiring patterns located above and under the ceramic layers, contributes to high densification of various electronic devices in circuit structure.. In order to attain further densification and composition of such a multilayer circuit board, there has been proposed a cavitied multilayer circuit board. According to such a cavitied multilayer circuit board, it is possible to arrange another component such as an IC, for example, in the cavity, thereby attaining not only high densification but composition.

In order to obtain the aforementioned ceramic multilayer circuit board, a cavitied ceramic multilayer block must be manufactured. Such a cavitied ceramic multilayer block is basically manufactured through steps of stacking a plurality of ceramic green sheets with each other and pressing the as-obtained ceramic laminate. When the plurality of ceramic green sheets are successively stacked with each other, ceramic green sheets which are already provided with cavity holes for defining a cavity are stacked from an intermediate stage so that the ceramic laminate is provided with the cavity after such stacking. The cavitied ceramic laminate obtained in such a manner must then be pressed, so that the adhesion between the plurality of ceramic green sheets forming the laminate is improved. FIG. 3 is a sectional view showing an example of a conventional pressing method.

A ceramic laminate 1 shown in FIG. 3 comprises a plurality of ceramic green sheets 2 provided with no cavity holes, a plurality of ceramic green sheets 4, which are stacked thereon, provided with cavity holes 3, a plurality of ceramic green sheets 6, which are stacked thereon, provided with cavity holes 5 larger than the cavity holes 3, and a plurality of ceramic green sheets 8, which are stacked thereon, provided with cavity holes 7 larger than the cavity holes 5. The ceramic laminate 1 is provided with a cavity 9 which is defined by an assembly of the cavity holes 3, 5 and 7.

The aforementioned ceramic laminate 1 is introduced into a die 10, and an elastic member 11 which is identical in outside dimension to the ceramic green sheets 2, 4, 6 and 8 is placed thereon. Then, the elastic member 11 exerts a pressure onto the ceramic green sheets 2, 4, 6 and 8, thereby pressing the ceramic green sheets 2, 4, 6 and 8. The elastic member 11 is also used to exert a desired pressure into the cavity 9.

The ceramic green sheets 2, 4, 6 and 8 may alternatively be stacked with each other in the die 10.

Conductive patterns, wiring patterns and via holes which are formed in the interior or on the surface of the ceramic laminate 1 are omitted from FIG. 3.

A cavitied ceramic multilayer block obtained by pressing the ceramic laminate 1 as shown in FIG. 3 is then fired, thereby obtaining a desired cavitied ceramic multilayer circuit board.

However, the method of manufacturing a cavitied ceramic multilayer block employing the aforementioned pressing method has the following problems. FIG. 4 is an enlarged sectional view showing behavior of the elastic member 11 which is used in the pressing step shown in FIG. 3.

As shown in FIG. 4, the ceramic laminate 1 is pressed when the elastic member 11 exerts a pressure onto the ceramic laminate 1 along arrows 12. At this time, the elastic member 11 exerts the pressure not only in the direction of lamination as shown by arrows 13 but in directions for radially expanding the cavity 9 as shown by arrows 14, due to its freely deformable property. Consequently, wiring patterns (not shown) which are provided around the cavity 9 may be undesirably deformed so that the wiring patterns are misaligned with via holes to cause imperfect conduction therebetween and defective characteristics are caused by changes of spaces between the wiring patterns, while a tandem state of the via holes along the direction of lamination may be broken to cause imperfect conduction.

Further, corners of stages which are formed in the cavity 9 may be rounded because of the deformation of the elastic member 11. While wiring patterns are formed on the respective stages of the cavity 9 to be connected with an electronic component which is arranged in the cavity 9 by wire bonding, reliable wire bonding cannot be performed if the surfaces provided with the wiring patterns are rounded as described above. To this end, the stages of the cavity must be increased in width so that the wiring patterns are not influenced even if the corners of the stages of the cavity 9 are rounded. In this case, however, allowance is required in the design of the multilayer circuit board, to hinder high densification and miniaturization thereof.

In addition, the elastic member 11 may not necessarily be homogeneously deformed when the elastic member 11 is compressed. When the elastic member 11 is inhomogeneously deformed, the wiring patterns which are in contact with the elastic member may also be inhomogeneously deformed following the inhomogeneous deformation of the elastic member 11. Thus, the electronic component which is arranged in the cavity may be misregistered with the wiring patterns, to cause imperfect conduction. When resistors, for example, are printed in relation to such wiring patterns, resistance values supplied by the resistors may disadvantageously deviate from desired levels, in addition to the creation of imperfect conduction between the resistors and the wiring patterns.

Even if the thicknesses of the wiring patterns are relatively largely superposed in a specific portion of the ceramic laminate 1, further, the elastic member 11 which is deformed itself may absorb the thicknesses of the wiring patterns to define an undesirable projection in the specific portion of the ceramic laminate 1 after pressing. Such a projection causes variation in the height of the electronic component which is arranged in the cavity 9 resulting in erroneous interconnection by wire bonding, or dispersion in the thickness of resistor films in printing of the resistors.

SUMMARY OF THE INVENTION

Accordingly, an object of the present invention is to provide a method of manufacturing a cavitied ceramic multilayer block, which can solve the aforementioned various problems.

The method of manufacturing a cavitied ceramic multilayer block according to the present invention comprises a step of preparing a first ceramic green sheet which is provided with a cavity hole for defining a cavity and a second ceramic green sheet which is provided with no cavity hole, and a step of stacking the first ceramic green sheet on the second ceramic green sheet. In order to solve the aforementioned technical problems, the method according to the present invention further comprises the steps of preparing a rigid plate which is sized to be in contact with the overall major surface of the first ceramic green sheet and provided with a hole equivalent to or slightly smaller than the cavity hole, placing the rigid plate on the first ceramic green sheet, placing an elastic member on the rigid plate, and exerting a pressure from the elastic member onto the first ceramic green sheet through the rigid plate.

According to the present invention, the elastic member exerts a pressure onto the ceramic green sheet which is provided with the cavity hole through the rigid plate, whereby it is possible to prevent the elastic member from causing radial expansion of the cavity. Further, the cavity is prevented from deforming which results in radial expansion of the cavity caused by the frictional force between the rigid plate and the ceramic green sheet which is in contact with the same. Regardless of deformation of the elastic member, the surface of the ceramic green sheet which is in contact with the rigid plate is forcibly flattened.

According to the present invention, as hereinabove described, the cavity is prevented from being undesirably deformed in the pressing step. Consequently, undesired deformation of the wiring patterns which are provided around the cavity is also prevented to thereby improve reliability in conduction between the wiring patterns and via holes. Further, the via holes are prevented from deviating from a tandem state, whereby reliability in conduction of the via holes which are longitudinally aligned with each other is improved. In addition, changes of spaces between the wiring patterns or the via holes are reduced, whereby desired characteristics can be stably attained. Thus, the via holes can be reduced in diameter and the wiring patterns can be reduced in thickness and pitch, to enable high densification and miniaturization of a ceramic multilayer circuit board.

According to the present invention, further, reliability in wire bonding is improved since corners of stages provided in the cavity are not rounded. In addition, regions which are provided with wiring patterns to be subjected to wire bonding are not narrowed by rounded corners of the stages, whereby it is possible to efficiently arrange the wiring patterns to be subjected to wire bonding. This also contributes to high densification and miniaturization of a multi-layer circuit board.

According to the present invention, further, the surface of the ceramic green sheet which is in contact with the rigid plate is maintained in a flat state, while undesired deformation of the wiring patterns provided on the surface is prevented. Consequently, reliability in conduction, as well as the product yield are improved, while thicknesses of resistors, for example, are stabilized in printing, resulting in minimum dispersion of resistance values.

According to the present invention, hardly any projection is created by superposition of thicknesses of the wiring patterns which are formed in the ceramic laminate, whereby an electronic component which is mounted on the as-obtained multilayer circuit board is stabilized in height. Thus, reliability in wire bonding and the product yield are improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

FIGS. 1A to 1D successively show some steps which are included in a method of manufacturing a cavitied ceramic multilayer block according to an embodiment of the present invention.

Figure 1A:
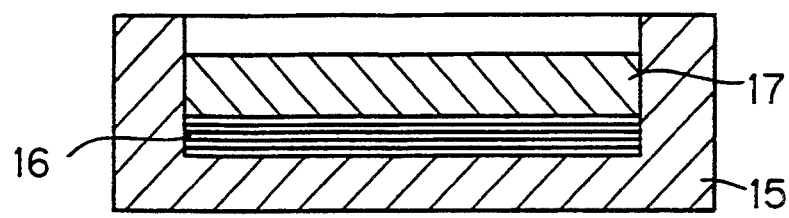
FIGS. 1A to 1D are sectional views successively showing some steps which are included in a method of manufacturing a cavitied ceramic multilayer block according to an embodiment of the present invention.

First, a plurality of ceramic green sheets 16 which are provided with no cavity holes are placed in a die 15 in a stacked state, as shown in FIG. 1A. Then a press plate 17 of a rigid body is inserted in the die 15, to press the plurality of ceramic green sheets 16.

Figure 1B:
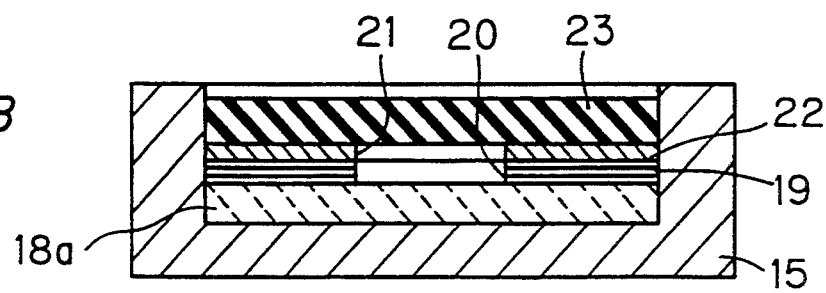

FIG. 1B shows a laminate 18a of the as-pressed plurality of ceramic green sheets 16. A plurality of stacked ceramic green sheets 19 are placed on this laminate 18a. The respective ceramic green sheets 19 are provided with cavity holes 20 for defining a cavity. The plurality of ceramic green sheets 16, the plurality of ceramic green sheets 19 and a plurality of ceramic green sheets which are stacked in a later step may be introduced in the die 15 in previously stacked states, or may be stacked in the die 15.

As shown in FIG. 1B, a rigid plate 22 which is sized to be in contact with the overall major surface of the uppermost ceramic green sheet 19 and provided with a hole 21 equivalent to or slightly smaller than each cavity hole 20 is prepared. The rigid plate 22 is made of a rigid body such as a metal, resin or ceramic. While the rigid plate 22 may have an arbitrary thickness, its thickness is preferably 0.1 to 2 mm, for example, in consideration of handlability. This rigid plate 22 is placed on the ceramic green sheets 19, and an elastic member 23 is further placed on this rigid plate 22. The elastic member 23 is made of silicone rubber, for example.

Figure 2:
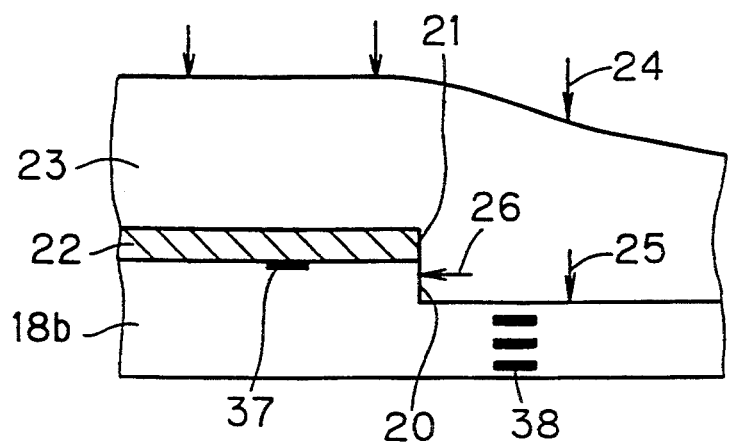
FIG. 2 is an enlarged sectional view showing behavior of an elastic member 23 in the step shown in FIG. 1B.
Figure 3:
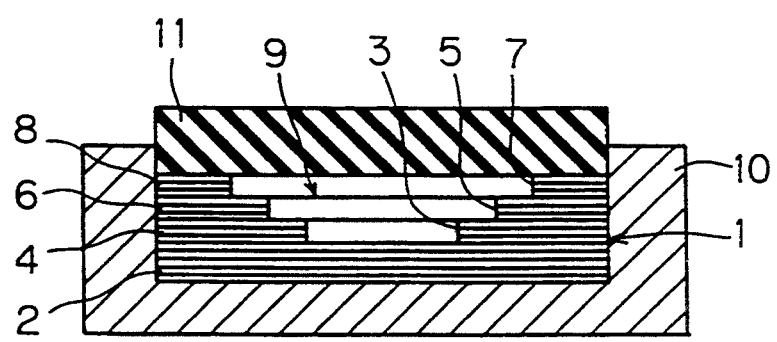
FIG. 3 is a sectional view showing a pressing step which is included in a conventional method of manufacturing a cavitied ceramic multilayer block.
Figure 4:
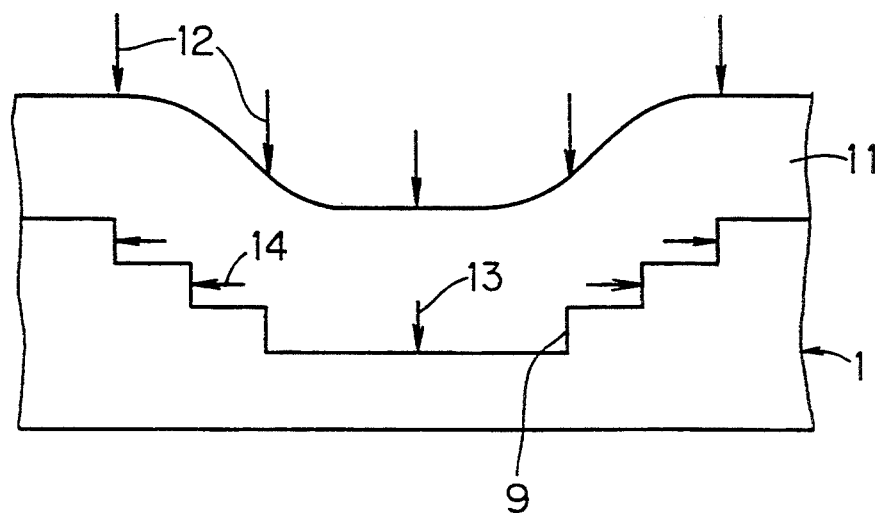
FIG. 4 is an enlarged sectional view showing behavior of an elastic member 11 in the pressing step shown in FIG. 3.

In the aforementioned state, the elastic member 23 exerts a pressure onto the ceramic green sheets 19 through the rigid plate 22. FIG. 2 illustrates the current behavior of the elastic member 23. Referring to FIG. 2, a laminate 18b which is formed by the aforementioned laminate 18a and the plurality of ceramic green sheets 19 is illustrated as an integral laminate. When a pressure is applied to the elastic member 23 along arrows 24, the laminate 18b is subjected not only to a pressure in the direction of lamination of the laminate 18b as shown by arrow 25 but is to also subjected to a force for expanding the cavity holes 20 as shown by arrow 26, due to the property of the elastic member 23. However, the force along arrow 26 is suppressed by the rigid plate 22, whereby the cavity holes 20 are prevented from expanding. Further, a surface of the laminate 18b which is in contact with the rigid plate 22 is maintained flat by the rigid plate 22. Such function of the rigid plate 22 is also effective in a later pressing step.

Figure 1C:
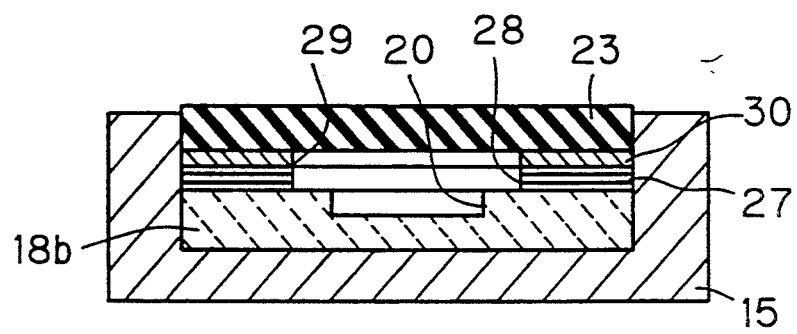

Then, a plurality of stacked ceramic green sheets 27 are placed on the laminate 18b, as shown in FIG. 1C. The respective ceramic green sheets 27 are provided with cavity holes 28 which are larger than the cavity holes 20. Further, a rigid plate 30 having a hole 29 which is equivalent to or slightly smaller than each cavity hole 28 is placed on the ceramic green sheets 27, and the elastic member 23 exerts a pressure onto the ceramic green sheets 27 through the rigid plate 30 similarly to the aforementioned step shown in FIG. 1B, to press the plurality of ceramic green sheets 27.

Figure 1D:
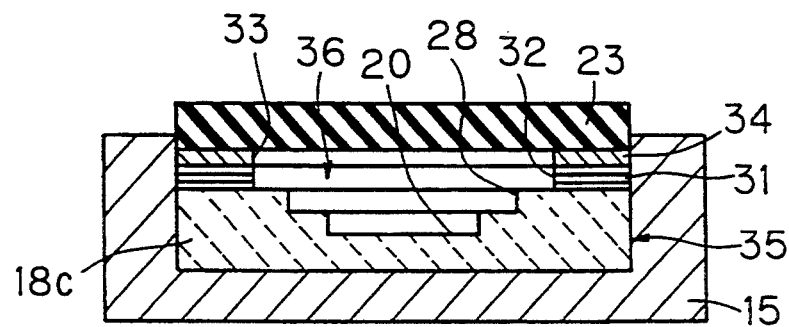

FIG. 1D shows a laminate 18c, which is formed by the laminate 18b shown in FIG. 1C and the plurality of ceramic green sheets 27 stacked thereon. A plurality of ceramic green sheets 31 are further placed on the laminate 18c. The respective ceramic green sheets 31 are provided with cavity holes 32, which are larger than the cavity holes 28. A rigid plate 34 having a hole 33 which is equivalent to or slightly smaller than each cavity hole 32 is placed on the ceramic green sheets 31, and the elastic member 23 exerts a pressure onto the ceramic green sheets 31 through the rigid plate 34, similarly to the aforementioned step.

Thus obtained is a ceramic multilayer block 35 which is formed by the laminate 18c and the plurality of ceramic green sheets 31, with a cavity 36 defined by an assembly of the cavity holes 20, 28 and 32. This ceramic multilayer block 35 is then fired, thereby obtaining a desired cavitied ceramic multilayer circuit board. Conductive patterns, wiring patterns and via holes which are formed in the interior or on the surface of the ceramic multilayer block 35 are omitted from FIGS. 1A to 1D, while FIG. 2 illustrates wiring patterns 37 and 38. These wiring patterns 37 and 38, the via holes and the like are already provided on specific ones of the ceramic green sheets in stages before stacking.

In each of the aforementioned pressing steps, the elastic member 23 may be subjected to a pressure by a rigid press, or a hydrostatic press.

The die 15 employed in the aforementioned embodiment may be replaced by a simple base plate, to carry out the respective steps shown in FIGS. 1A to 1D thereon.

While the cavity 36 defined in the ceramic multilayer block 35 is provided with some stages in the embodiment shown in FIGS. 1A to 1D and 2, the present invention is also applicable to a ceramic multilayer block comprising a cavity having no such stages. Further, the number of such stages can be arbitrarily selected. In addition, the cavity 36 may have any arbitrary shape such as a circular shape or a rectangular shape.

Although the present invention has been described and illustrated in detail, it is clearly understood that the same is by way of illustration and example only and is not to be taken by way of limitation, the scope of the present invention being limited only by the terms of the appended claims.

What is claimed is:

1. A method of manufacturing a cavitied ceramic multilayer block, comprising the steps of:

preparing a first ceramic green sheet being provided with a first cavity hole for defining a cavity, a second ceramic green sheet being provided with a second cavity hole that is larger than said first cavity hole and a third ceramic green sheet with no cavity hole;

stacking said first ceramic green sheet on said third ceramic green sheet;

preparing a first rigid plate being sized to be in contact with the overall major surface of said first ceramic green sheet and provided with a hole being equivalent to or slightly smaller than said first cavity hole;

placing said first rigid plate on said first ceramic green sheet;

placing an elastic member on said first rigid plate;

exerting a pressure from said elastic member onto said first ceramic green sheet through said first rigid plate;

stacking said second ceramic green sheet on said first ceramic green sheet;

preparing a second rigid plate sized to contact the overall major surface of said second ceramic green sheet and provided with a hole being equivalent to or slightly smaller than said second cavity hole;

placing said second rigid plate on said second ceramic green sheet;

placing said elastic member on said second rigid plate; and exerting a pressure from said elastic member onto said second ceramic green sheet through said second rigid plate.

2. A method in accordance with claim 1, wherein said steps of exerting a pressure onto said first ceramic green sheet and said second ceramic green sheet are carried out in a die for receiving said first ceramic green sheet, said second ceramic green sheet, said third ceramic green sheet and said rigid plate.

3. A method in accordance with claim 2, wherein said elastic member is subjected to a pressure by a rigid press in said step of exerting a pressure onto said first ceramic green sheet.

4. A method in accordance with claim 2, wherein said elastic member is subjected to a pressure by a hydrostatic press in said step of exerting a pressure onto said first ceramic green sheet.

5. A method in accordance with claim 1, wherein said rigid plate is 0.1 to 2 mm in thickness.

6. A method in accordance with claim 1, wherein said elastic member is made of silicone rubber.

7. The method of claim 1, further comprising the step of:

preparing a fourth ceramic green sheet having a third cavity hole that is larger than said second cavity hole;

stacking said fourth ceramic green sheet on said second ceramic green sheet;

preparing a fourth rigid plate sized to contact the overall major surface of said fourth ceramic green sheet and provided with a hole being equivalent to or slightly smaller than said third cavity hole;

placing said fourth rigid plate on said fourth ceramic green sheet;

placing said elastic member on said fourth rigid plate; and exerting a pressure from said elastic member onto said fourth ceramic green sheet through said fourth rigid plate.

8. A method of manufacturing a cavitied ceramic multilayer block, the method comprising the steps of:

preparing a first ceramic green sheet having a first cavity hole for defining a cavity, a second ceramic green sheet having a second cavity hole that is larger than said first cavity hole and a third ceramic green sheet with no cavity hole;

stacking said first ceramic green sheet on said third ceramic green sheet;

placing on said first ceramic green sheet a first rigid plate having a hole that is the same size as or slightly smaller than said first cavity hole;

exerting a pressure on said first ceramic green sheet through said first rigid plate;

stacking said second ceramic green sheet on the first ceramic green sheet;

placing on said second ceramic green sheet a second rigid plate having a hole that is the same size as or slightly smaller than said second cavity hole; and exerting a pressure onto said second ceramic green sheet through said second rigid plate.

9. A method of manufacturing a cavitied ceramic multilayer block, the method comprising the steps of:

preparing a plurality of ceramic green sheets, at least one of the plurality of ceramic green sheets having no cavity hole and at least two of the ceramic green sheets each having a cavity hole formed therein, the cavity hole in one of the at least two ceramic green sheets being different in size from the cavity hole formed in the other of the at least two ceramic green sheets;

stacking the ceramic green sheets; and separately pressing each of the at least two ceramic green sheets having cavity holes with one of a plurality of rigid press plates, each of the rigid press plates having holes being the same size as or slightly smaller than the cavity hole formed in a respective one of the at least two ceramic green sheets.

* * * * *